US011347999B2

(12) United States Patent
Ambrogio et al.

(10) Patent No.: US 11,347,999 B2
(45) Date of Patent: May 31, 2022

(54) CLOSED LOOP PROGRAMMING OF PHASE-CHANGE MEMORY

(71) Applicant: INTERNATIONAL BUSINESS MACHINES CORPORATION, Armonk, NY (US)

(72) Inventors: Stefano Ambrogio, San Jose, CA (US); Geoffrey Burr, Cupertino, CA (US); Charles Mackin, San Jose, CA (US); HsinYu Tsai, San Jose, CA (US); Pritish Narayanan, San Jose, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 633 days.

(21) Appl. No.: 16/419,036

(22) Filed: May 22, 2019

(65) Prior Publication Data

US 2020/0372335 A1 Nov. 26, 2020

(51) Int. Cl.
*G06N 3/06* (2006.01)
*G06N 3/063* (2006.01)
(Continued)

(52) U.S. Cl.
CPC ........... *G06N 3/0635* (2013.01); *G06N 3/084* (2013.01); *G11C 13/0004* (2013.01);
(Continued)

(58) Field of Classification Search
CPC .. G06N 3/0635; G06N 3/084; G11C 13/0004; G11C 13/0069; G11C 2013/0078; G11C 2013/0092; G11C 2213/70
See application file for complete search history.

(56) References Cited

U.S. PATENT DOCUMENTS 5,056,037 A * 10/1991 Eberhardt ............ G06N 3/0635
708/801
5,343,555 A * 8/1994 Yayla ................... G06N 3/0675
706/35
(Continued)

FOREIGN PATENT DOCUMENTS

CN 107408222 A 11/2017
CN 108229669 A 6/2018
EP 3133535 A1 2/2017

OTHER PUBLICATIONS

Bedeschi et al., "4-Mb MOSFET-Selected MicroTrench Phase-Change Memory Experimental Chip," IEEE Journal of Solid-State Circuits, vol. 40, No. 7, Jul. 2005. 9 pages.
(Continued)

*Primary Examiner* — Vanthu T Nguyen
(74) *Attorney, Agent, or Firm* — Cantor Colburn LLP; Randall Bluestone

(57) ABSTRACT

A computer implemented method includes updating weight values associated with a plurality of analog synapses in a cross-bar array that implements an artificial neural network by sending a pulse sequence to the analog synapses. Each analog synapse includes a conductance unit, wherein a weight value of the analog synapse is based on a conductance value of the conductance unit. The pulse sequence changes the conductance value. The method further includes comparing the weight values of the analog synapses with target weight values associated with the analog synapses and selecting a set of analog synapses based on the comparison. The method further includes updating the weight values of the selected analog synapses by sending a set of electric pulses of varying durations.

25 Claims, 11 Drawing Sheets

(51) Int. Cl.
*G06N 3/08* (2006.01)
*G11C 13/00* (2006.01)

(52) U.S. Cl.
CPC .. *G11C 13/0069* (2013.01); *G11C 2013/0078* (2013.01); *G11C 2013/0092* (2013.01); *G11C 2213/70* (2013.01)

(56) References Cited

U.S. PATENT DOCUMENTS

| | | | |
|---|---|---|---|
| 7,872,916 | B2 | 1/2011 | Bathul |
| 8,902,632 | B2 * | 12/2014 | Kim ........................ G11C 11/21 365/158 |
| 9,208,434 | B2 * | 12/2015 | Suri ......................... G06N 3/08 |
| 9,842,647 | B1 | 12/2017 | Strachan |
| 2018/0232628 | A1 * | 8/2018 | Park ........................ G06N 3/063 |
| 2018/0330236 | A1 | 11/2018 | Hou |
| 2019/0005381 | A1 | 1/2019 | Li et al. |
| 2019/0042915 | A1 | 2/2019 | Akin |
| 2019/0042917 | A1 | 2/2019 | Gurwicz |

OTHER PUBLICATIONS

Nandakumar et al., "A phase-change memory model for neuromorphic computing", Journal of Applied Physics, 124:152135. Published Oct. 17, 2018. 11 pages.

International Search Report; International Application No. PCT/IB2020/053316; International Filing Date: Apr. 7, 2020; dated Jun. 28, 2020; 9 pages.

* cited by examiner

CLOSED LOOP PROGRAMMING OF PHASE-CHANGE MEMORY

BACKGROUND

The present invention generally relates to computer technology, and more specifically, to programming a phase-change memory (PCM) cell using closed loop programming.

PCM exploits characteristics of materials that have the property of switching between two phases having distinct electrical characteristics. For example, these materials can switch between (i) an amorphous, disorderly, phase and (ii) a crystalline or polycrystalline, orderly, phase, with the two phases being associated with considerably different values of resistivity. In addition, intermediate configurations, in which the material has only partially switched to the amorphous phase or to the crystalline phase, can be associated with intermediate values of resistivity.

SUMMARY

According to one or more embodiments, a computer-implemented method includes updating weight values associated with a analog synapses in a cross-bar array that implements an artificial neural network by sending a pulse sequence to the analog synapses. Each analog synapse includes a conductance unit, wherein a weight value of the analog synapse is based on a conductance value of the conductance unit. The pulse sequence changes the conductance value of the conductance unit. The method further includes comparing the weight values of the analog synapses with target weight values associated with the analog synapses. The method further includes selecting a set of analog synapses from the cross-bar array based on the comparison. The selection is indicated using a selection flag associated with the analog synapses. The method further includes updating the weight values of the each analog synapse from the set of analog synapses that is selected by sending, to the set of analog synapses, a set of electric pulses of varying durations. The set of electric pulses changes the conductance values of the conductance units corresponding to the set of analog synapses.

In one or more examples, the pulse sequence that is sent to the analog synapses is of a predetermined duration, wherein the uniform weight pulse sequence includes multiple electric current pulses with decreasing magnitudes. In one or more examples, the conductance unit is a set of non-volatile memory devices. Further, a weight value associated with the analog synapse is computed based on conductance values of each of the non-volatile memory devices. In one or more examples, the non-volatile memory devices are phase change memory devices. In one or more examples, the non-volatile memory devices are resistance random access memory devices.

In one or more examples, the set of non-volatile memory devices includes four non-volatile memory devices, which are configured to form a more-significant pair (MSP) and a less-significant pair (LSP). A weight value of the analog synapse is computed as $W=F\times(G^+-G^-)+g^+-g^-$, where F is a scaling factor, $G^+$ and $G^-$ are conductance values of the MSP, and $g^+$ and $g^-$ are conductance values of the LSP.

In one or more examples, changing the conductance value of a conductance unit comprises changing conductance values of each non-volatile memory device from the conductance unit according to a predetermined order for updating the conductance values. In one or more examples, according to the predetermined order, the conductance values of the non-volatile memory devices in the MSP are updated first. Further, according to the predetermined order, the conductance value of the non-volatile memory devices in the MSP are updated according to a sign flag associated with the non-volatile memory devices.

In one or more examples, selecting the set of analog synapses includes selecting the set of analog synapses for which a difference between weight values and target values is greater than a predetermined threshold.

In one or more examples, the method further includes removing a first analog synapse from the set of analog synapses, wherein the difference in the weight value and the target weight value for the first analog synapse is within the predetermined threshold. For example, the first analog synapse is removed from the set of analog devices in response to the weight value of the first analog synapse being updated by the set of electric pulses of varying durations.

In one or more examples, the set of electric pulses of varying durations includes a first electric pulse for a first analog synapse, the first electric pulse based on a first difference between the weight value and the target weight value of the first analog synapse.

The above-described features can also be provided at least by a system, a computer program product, and a machine, among other types of implementations. According to one or more embodiments of the present invention, a system includes a processor, a co-processor comprising one or more cross-bar arrays, and a processor configured to implement an artificial neural network using the co-processor by mapping a layer of the artificial neural network with a cross-bar array. According to one or more embodiments a computer program product includes a computer readable storage medium having program instructions embodied therewith, the program instructions executable by a processing circuit to perform a method to implement an artificial neural network by mapping a layer of the artificial neural network with a cross-bar array.

According to one or more embodiments, a cross-bar array includes multiple phase change memory devices, where a phase change memory device is at each cross-point in the cross-bar array. Every set of four phase change memory devices forms a conductance unit, and a set of such conductance units represents a set of analog synapses in an artificial neural network. An electric circuit programs conductance values of the phase change memory devices by performing a method that includes receiving a pulse sequence for the plurality of analog synapses in the cross-bar array, wherein a weight value of an analog synapse is based on a conductance value of the conductance unit, and the pulse sequence changes the conductance value of the conductance unit. The method further includes updating the weight values of the each analog synapse from a set of analog synapses that is selected by receiving, for the set of analog synapses, a set of electric pulses of varying durations. The set of electric pulses changes the conductance values of the conductance units corresponding to the set of analog synapses. The set of analog synapses from the cross-bar array is selected based on comparing the weight values of the plurality of analog synapses with target weight values associated with the analog synapses.

According to one or more embodiments, a computer-implemented method includes configuring, from a set of phase change memory devices in a cross-bar array, two pairs of phase change memory devices as a conductance unit, wherein the set of conductance units represents a plurality of analog synapses in an artificial neural network. The method further includes sending a pulse sequence to the set of analog synapses in the cross-bar array, wherein a weight value of an analog synapse is based on a conductance value of the conductance unit, and the pulse sequence changes the conductance value of the conductance unit. The method further includes updating the weight values of the each analog synapse from a subset of analog synapses that is selected by sending, to the subset of analog synapses, a set of electric pulses of varying durations. The set of electric pulses changes the conductance values of the conductance units corresponding to the subset of analog synapses. The subset of analog synapses from the cross-bar array is selected based on comparing the weight values of the set of analog synapses with target weight values associated with the analog synapses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
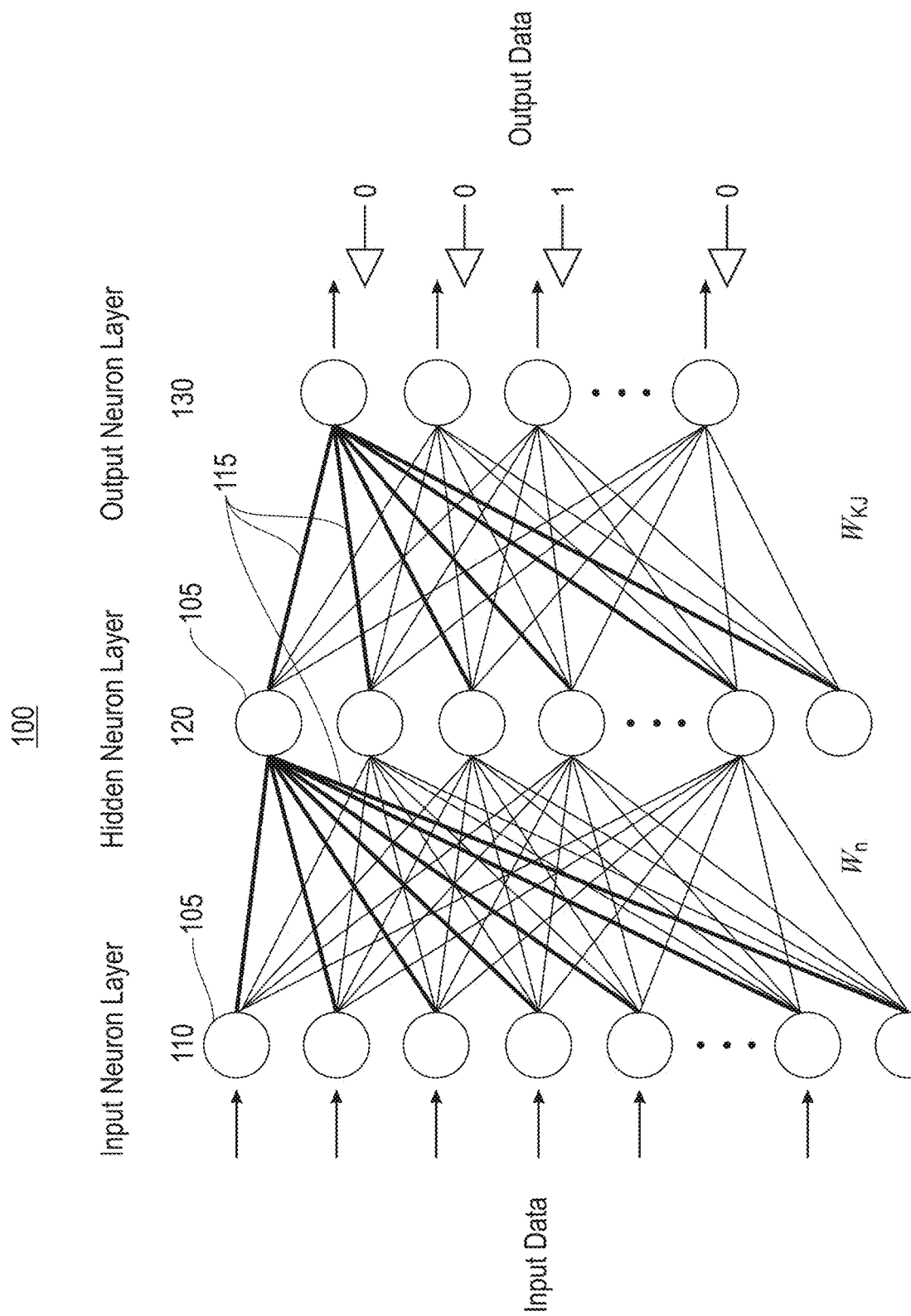
FIG. 1 depicts a block diagram of a deep neural network.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

As noted earlier, phase-change memory (PCM) elements exploit the characteristics of materials that have the property of switching between two phases having distinct electrical characteristics. Currently, the alloys of Group VI of the periodic table, such as Te or Se, referred to as chalcogenides or chalcogenic materials, can be advantageously used in phase-change cells. In chalcogenides, the resistivity varies by two or more orders of magnitude when the material passes from the amorphous phase (more resistive) to the crystalline phase (less resistive) and vice versa.

Such characteristics lend the PCM elements to be used for providing memory cells and arrays for digital data storage. In particular, in phase-change memories, a portion of chalcogenic material is used as programmable resistor, which can be electrically heated by a controlled current so as to switch between a high resistance condition and a low resistance condition and vice versa, respectively associated to which are a first logic value and a second logic value. The state of the chalcogenide can be read by applying a voltage sufficiently low as not to cause a sensible heating and by measuring the current that traverses it. Since the current is proportional to the conductance of the chalcogenic material, it is possible to distinguish the two states. For example, a chalcogenide that is formed by an alloy of Ge, Sb and Te (Ge2Sb2Te5, GST) is widely used for storing information in overwritable memory devices, such as in computers and other types of digital storage devices.

The phase transitions between the highly resistive amorphous state and the highly conductive crystalline state can be induced electrically through current pulses of appropriate amplitude and duration. In particular, the transition towards the amorphous state ("reset") is obtained by applying current pulses of an amplitude sufficient to heat the chalcogenide beyond the melting point by Joule effect. The current pulses that are used are with steep edges so that cooling of the chalcogenide is so fast as to prevent crystallization, for example, rectangular current pulses. The transition towards the crystalline state ("set") can be induced using different techniques. Accordingly, because the conductance of the phases of the PCM device differ, it is possible to use this to store bits. It is also possible to control the temperature such that the bit enters a state with intermediate conductance. In addition to storing bits, this can be used to perform calculations, as a predetermined group (or set) of sub-threshold phase changes can gradually add up to a bit flip.

The advantages of doing calculations this way are twofold: it avoids trips back and forth to memory because the operations take place in memory, and operations can be done in parallel. Those differences have natural parallels with the behavior of a population of neurons, which makes PCM devices suitable for use in artificial neural networks (ANNs), such as deep neural network (DNN).

PCM further lends itself for use in DNNs (or other types of neural networks). This is because neuronal activity is not a binary, all-or-nothing state—it can adopt a range of intermediate behaviors between on and off. Therefore, a PCM device's ability to adopt a state between 1 and 0 allows it to directly model the behavior of neurons.

To use this for training, a grid (or array) of PCM devices (bits) can be mapped to each layer of a DNN. A communication network made of wiring allows the neurons to communicate among themselves. The strength of that communication is set by the state of the memory—where it is on the spectrum between fully on and fully off. That state, in turn, is set by all the bits that feed into it. The communication hardware translates the variable-strength signals from a phase-change bit into signals of different durations, which are compatible with the digital communication network.

Typically, for implementing a DNN, forward inferencing calculations can be slow and energy intensive, owing to the need to transfer the weight data for the network between conventional digital memory chips and processor chips and the need to constantly maintain the weights in memory. As described above, analog non-volatile memory using PCM based bytes can accelerate forward inference and reduce energy consumption by performing parallelized multiply—accumulate operations in the analog domain at the location of the weight data and reducing the need to refresh stored weight data in memory. Practical applications of such a DNN are unlimited and can include real-time sensor data processing and inference for IoT devices, and the like.

The accuracy of forward inference strongly depends on accuracy of weight programming. However, programming analog memory, such as PCM, to the desired analog conductance values is not trivial, especially with variability in an analog memory array. For example, PCM devices can have different maximum conductance depending on the sizes of the memory cell and bottom electrode. Therefore, one single programming condition cannot bring all PCM devices in the array to the same analog conductance value. Further, some additional technical problems in practical implementation of such a PCM devices based DNN exist. For example, the hardware does not have the same range of states between 1 and 0 that make neural networks effective. Further, there is bit-to-bit variability in how the PCM devices respond. Another technical challenge with programming of PCM is simultaneously programming multiple devices in a finite time, since the iteration for each device can be different and can take infinitely long.

The techniques described herein using one or more embodiments of the present invention overcome such technical challenges. One or more embodiments of the present invention facilitate simultaneously programming multiple PCM devices to specific analog conductance states in a predefined timeframe. Other advantages and practical applications provided by one or more embodiments of the present invention will be apparent to those skilled in the art based on the description herein.

One or more embodiments of the present invention facilitate intermediate analog conductance programming of non-volatile memory devices, such as PCM devices, by overcoming device to device variability. Accordingly, one or more embodiments of the present invention provide row-by-row closed-loop programming of non-volatile memory to specific analog conductance states. Experimental results of one or more embodiments of the present invention have shown the described techniques to be robust to device variability, achieving desirable programming quality in a pre-defined timeframe.

FIG. 1 depicts a block diagram of a deep neural network. The depicted DNN 100 has an input layer 110, a hidden layer 120, and an output layer 130, each layer including neurons 105. DNNs are loosely inspired by biological neural networks. The neurons 105 act as parallel processing units that are interconnected by plastic synapses. By tuning weights of the interconnections, the DNN 100 can solve certain problems, such as classification problems, efficiently. The training of the DNN 100 is generally based on a global supervised learning algorithm typically referred to as back-propagation. During the training, the input data are forward-propagated through the neuron layers 110, 120, and 130, with the synaptic networks performing multiply-accumulate operations. The final layer (output layer 130) responses are compared with the input data labels and the errors are back-propagated. Both steps, forward-propagation and backward-propagation involve sequences of matrix-vector multiplications. Subsequently, the synaptic weights are updated to reduce the error. Because of the need to repeatedly perform these operations using very large datasets (multiple-gigabytes) to very large neural networks, this brute force optimization approach can take multiple days or weeks to train state-of-the-art networks on von Neumann machines. Accordingly, in one or more embodiments of the present invention, a co-processor that includes multiple cross-bar arrays of PCM devices and other analog communication links and peripheral circuitry to accelerate such steps of deep learning is used.

Figure 2A:
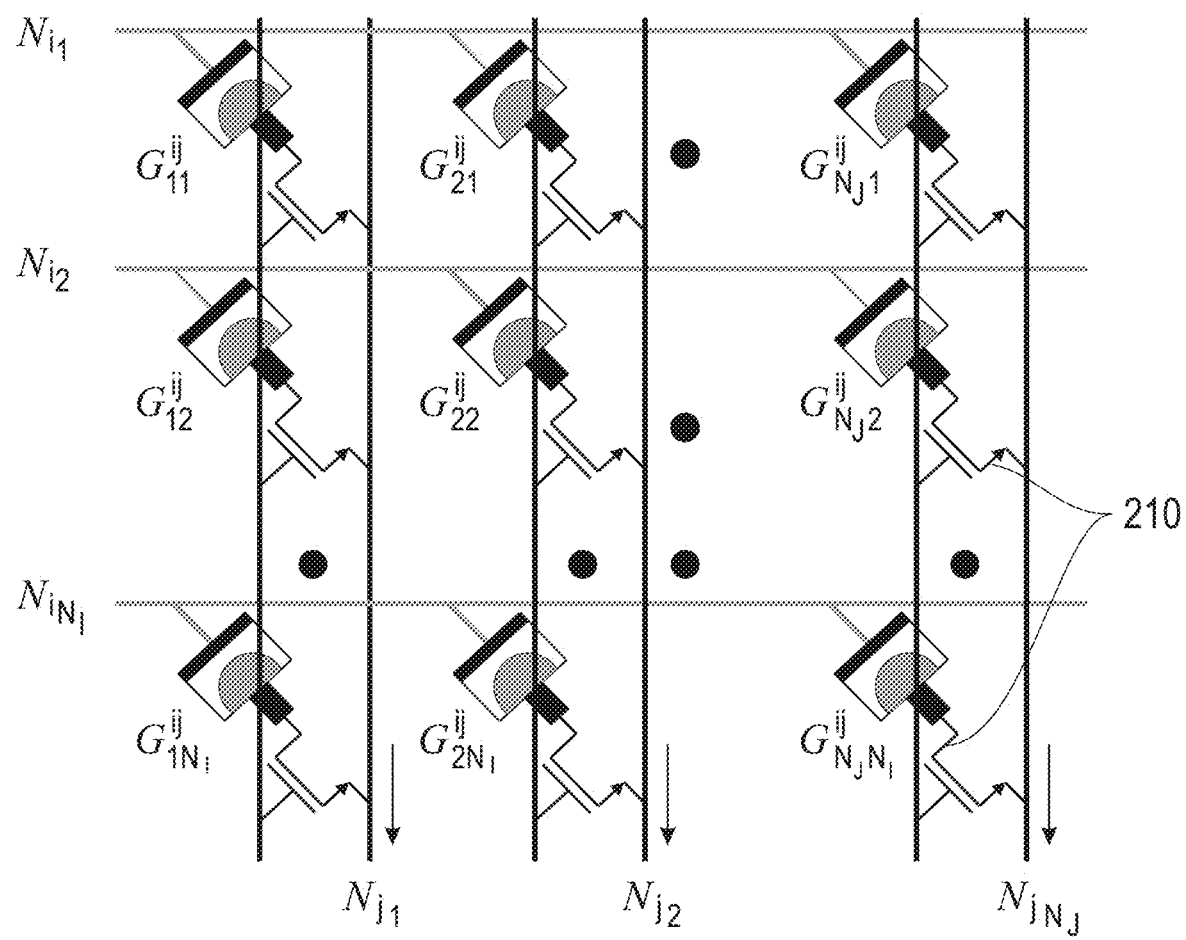
FIG. 2A, FIG. 2B, and FIG. 2C depict block diagrams of a deep neural network using a cross-bar array of analog memory according to one or more embodiments of the present invention.
Figure 2B:
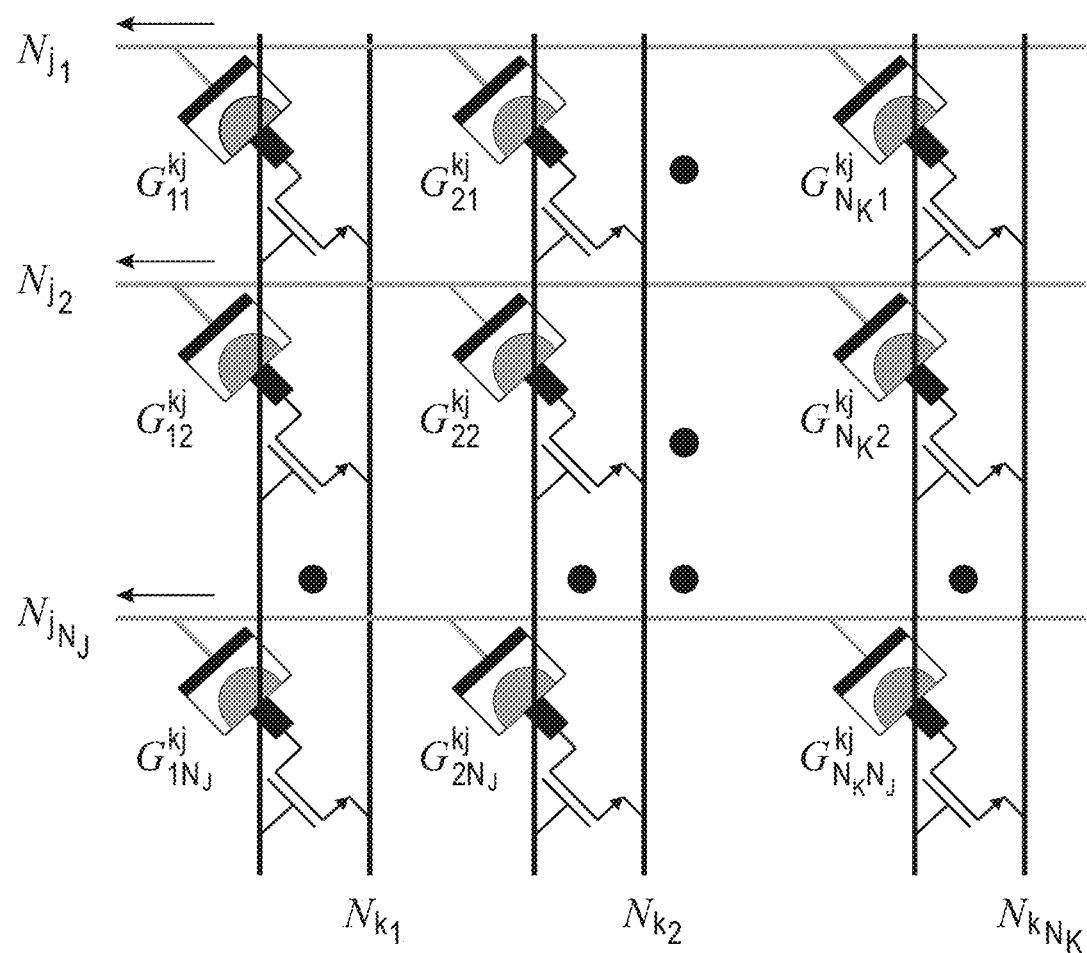
Figure 2C:
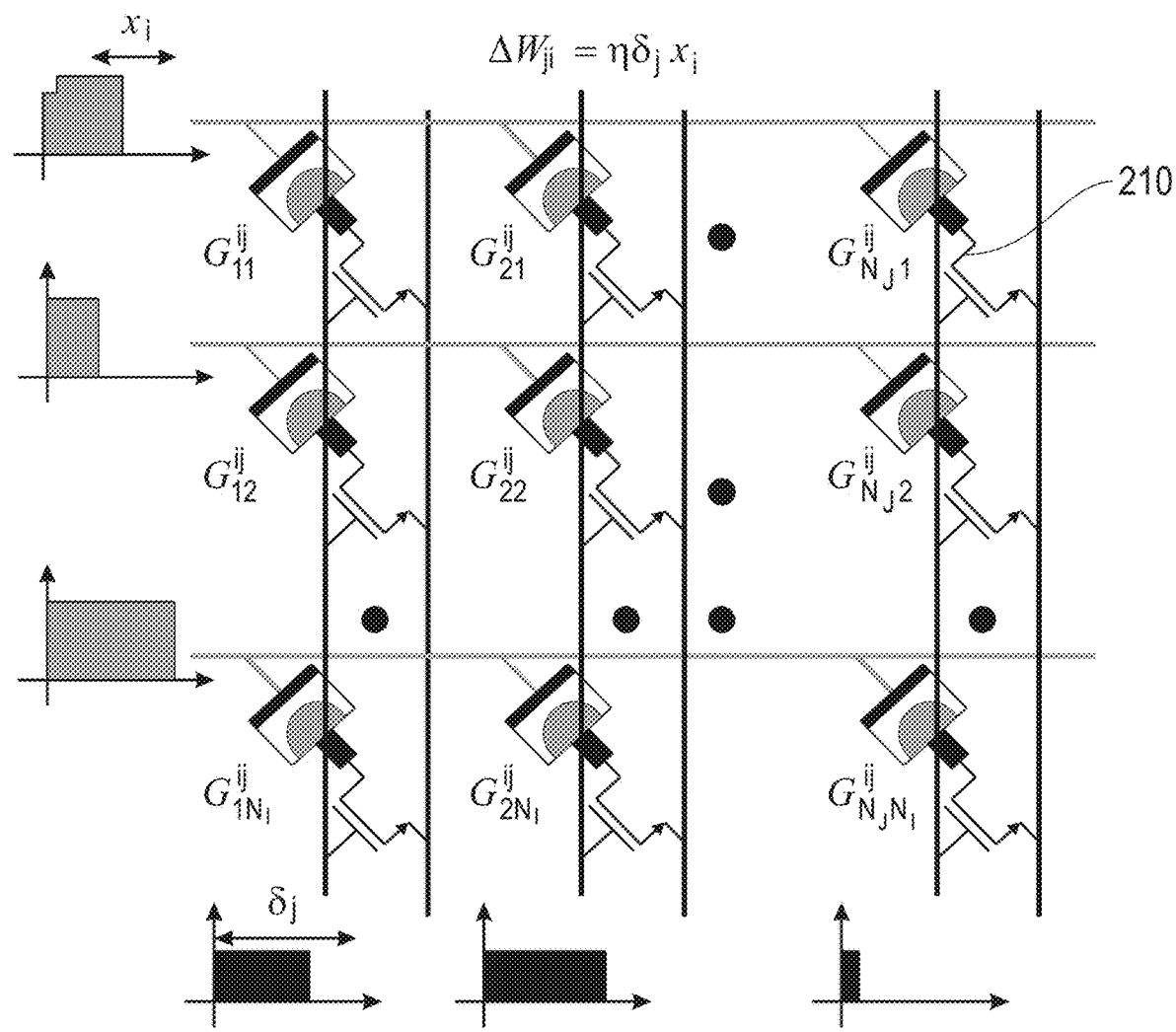

FIG. 2A, FIG. 2B, and FIG. 2C depict block diagrams of a deep neural network using a cross-bar array of analog memory according to one or more embodiments of the present invention. The synaptic weights associated with each layer (110, 120, and 130) of the DNN 100 in terms of the conductance values of non-volatile memory (NVM) devices 210 organized in a cross-bar array 200. The NVM devices 210 can be PCM devices, resistance random access memory (RRAM) devices, and the like. In FIGS. 2A, 2B, and 2C, various phases of implementing the DNN 100 are depicted—a forward propagation in FIG. 2A, a backward propagation in FIG. 2B, and a weight update in FIG. 2C.

In one or more examples, there are multiple such cross-bar arrays respectively corresponding to each of the multiple layers (110, 120, and 130) of the DNN 100. According to one or more embodiments of the present invention a co-processor/chip/system includes such cross-bar arrays 200 along with additional peripheral circuitry to implement the neuronal activation functions and communication between the cross-bar arrays 200.

Figure 3:
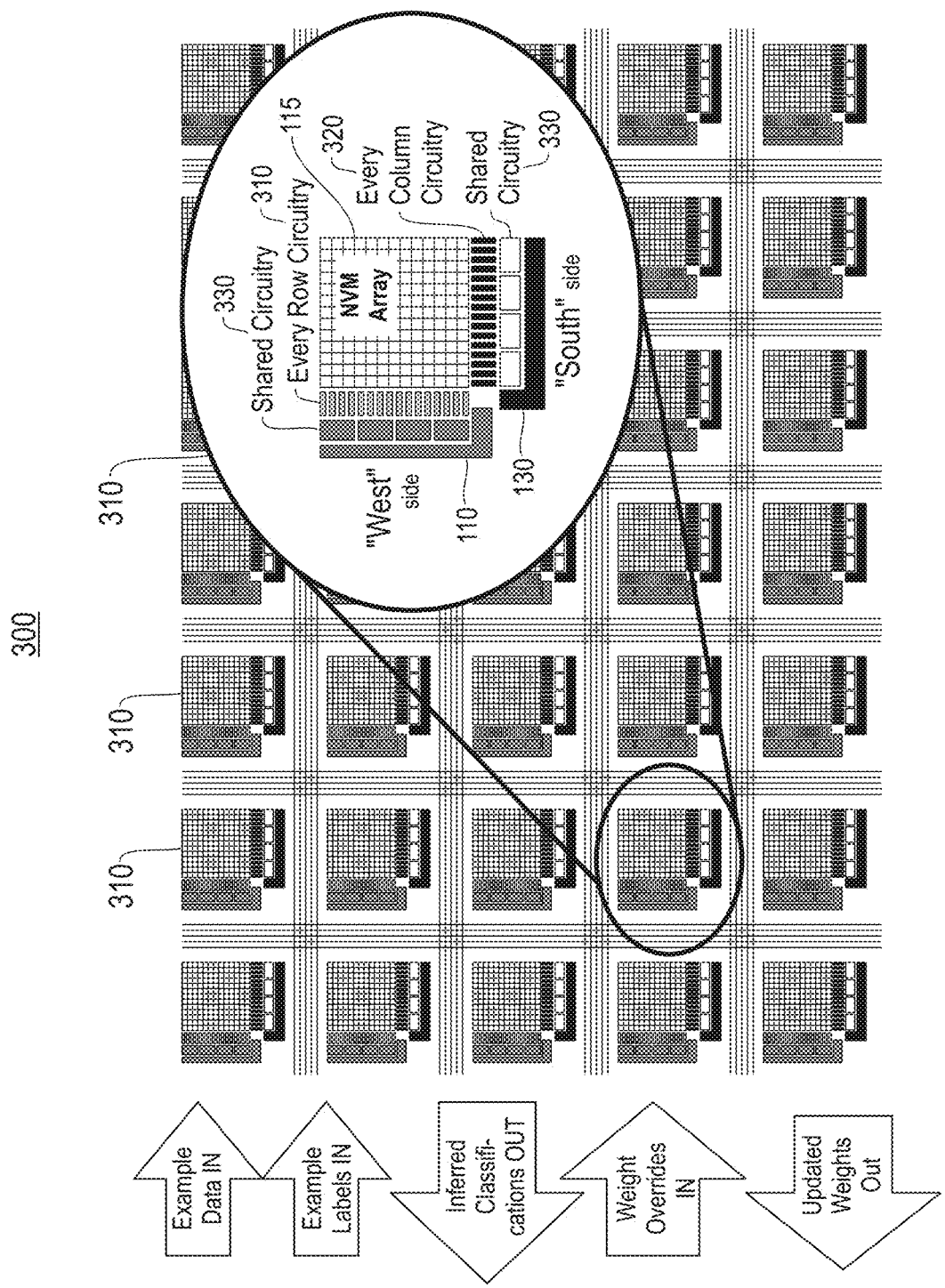
FIG. 3 depicts a block diagram of a phase change memory array device according to one or more embodiments of the present invention.

FIG. 3 depicts a block diagram of a phase change memory array device according to one or more embodiments of the present invention. The architecture depicts multiple identical array-blocks 310 connected by a flexible routing network on a chip/system 300. Each array-block 310 represents a cross-bar array 200 of NVM devices 210. The flexible routing network has at least three tasks: (1) to convey chip inputs (such as example data, example labels, and weight overrides) from the edge of the chip 300 to the device arrays 310, (2) to carry chip outputs (such as inferred classifications and updated weights) from the arrays 310 to the edge of the chip 300, and (3) to interconnect various arrays 310 in order to implement multi-layer neural networks. Each array 310 has input neurons 110 (here shown on the "West" side of each array) and output neurons 130 ("South" side), connected with a dense grid of synaptic connections 115. Peripheral circuitry is divided into circuitry assigned to individual rows (row circuitry 320) and columns (column circuitry 330), circuitry shared between a number of neighboring rows and columns.

According to one or more embodiments of the present invention, the cross-bar array 200 provides neuromorphic networks including spiking neuronal networks based on Spike Timing Dependent Plasticity (STDP) learning rules for neuromorphic integrated circuits. For example, one or more embodiments of the invention provide spike-based computation using complementary metal-oxide-semiconductor (CMOS) electronic neurons interacting with each other through nanoscale memory synapses such as the NVM devices 210 (e.g. PCM devices).

In such a neuromorphic network, the electronic neurons are interconnected via programmable electronic synapses represented by the NVM devices 210. The synaptic conductance changes with time as a function of the relative spike times of pre-synaptic and post-synaptic neurons as per STDP. Specifically, a STDP learning rule programs a synapse (NVM device 210) by increasing the conductance of the synapse if its post-synaptic neuron fires after its pre-synaptic neuron fires and decreases the conductance of a synapse if the order of two firings is reversed. The learning rules are defined by STDP, wherein the synaptic conductance changes with time as a function of the relative spike times of pre-synaptic and post-synaptic neurons. The change in synapse conductance depends on the precise delay between the firing events at the corresponding post-synaptic and pre-synaptic neurons. The longer the delay, the less the magnitude of synaptic conductance changes.

Figure 4:
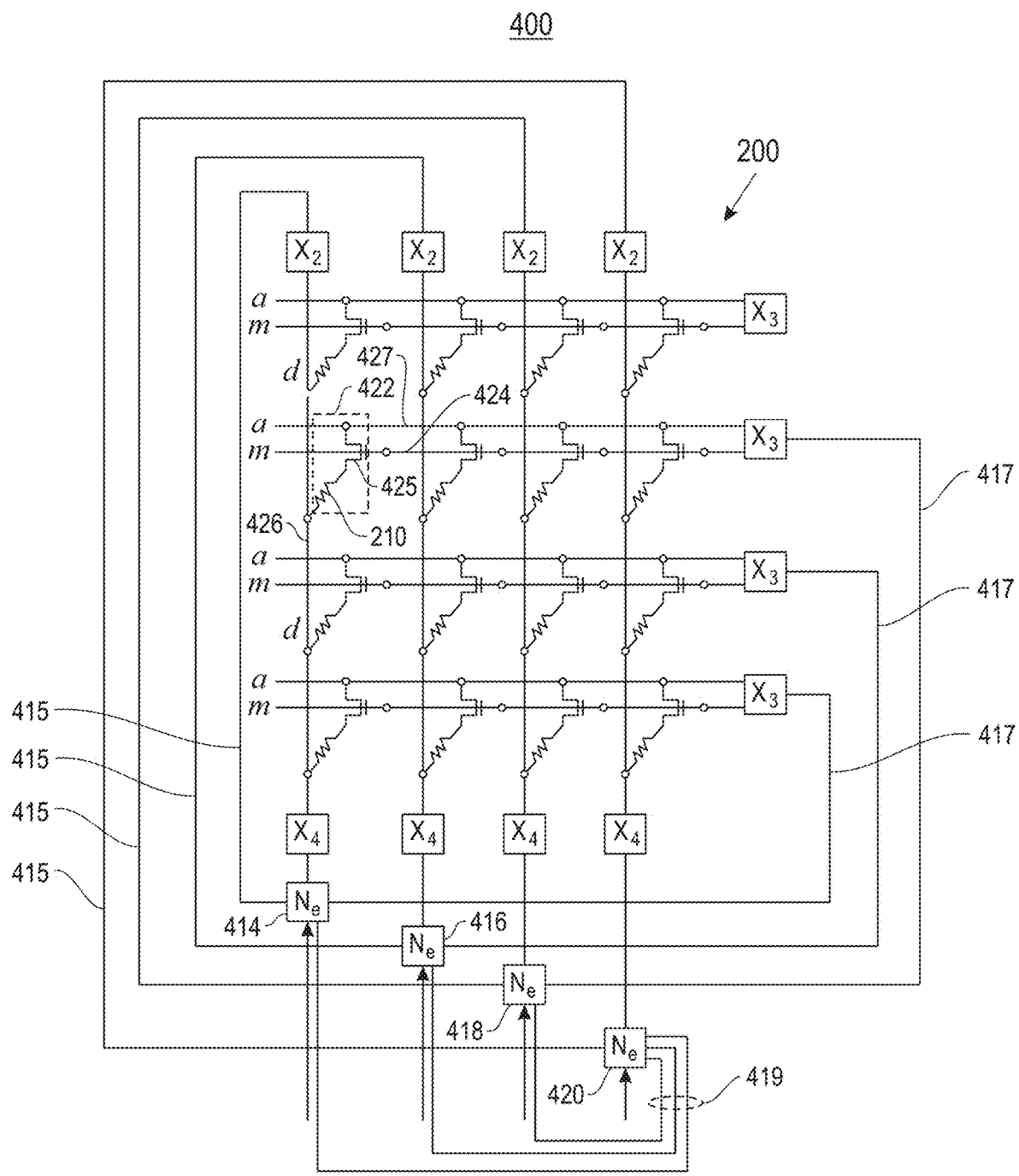
FIG. 4 depicts a structure of a neuromorphic system implemented using a cross-bar array coupled to multiple neurons as a network according to one or more embodiments of the present invention.

FIG. 4 depicts a structure of a neuromorphic system implemented using a cross-bar array coupled to multiple neurons as a network according to one or more embodiments of the present invention. The depicted neuromorphic system 400 includes multiple neurons 414, 416, 418 and 420 interconnected using the cross-bar array 200. In one example, the cross-bar array 200 has a pitch in the range of about 0.1 nm to 10 μm. The system 400 further includes synapse devices 422 including the NVM devices 210 used as variable state resistors at the cross-point junctions of the cross-bar array 412. The synapse devices 422 are connected to axon paths 424, dendrite paths 426 and membrane paths 427, such that the axon paths 424 and membrane paths 427 are orthogonal to the dendrites 426. The terms "axon path", "dendrite path" and "membrane path", are sometimes referred to as "axon", "dendrite" and "membrane", respectively.

A spiking electronic neuron integrates inputs from other neurons through the programmable NVM synapses (e.g., PCM devices) and spikes when the integrated input exceeds a pre-determined threshold. For example, in an implementation of STDP in a neuromorphic network, called binary probabilistic STDP, each electronic neuron remembers its last spiking event using a simple resistor-capacitor (RC) circuit. Thus, when an electronic neuron spikes, several events occur, as described below. In one example, the spiking neuron charges an internal "memory" capacitor to $V_0$, wherein the potential across the capacitor decays according to $V_t = V_0 e^{-t/Rc}$, with RC=50 ms.

The spiking neuron sends a nanosecond "alert" pulse on its axons and dendrites. If the alert pulse generated at the axon is a voltage spike, then downstream neurons receive a current signal, weighted by the conductance of a synapse (PCM devices) between each pair of involved neurons (which can then be integrated by the downstream neurons). The alert pulse generated at the dendrite is not integrated by upstream neurons, but serves as a hand-shake signal, relaying information to those neurons indicating that a programming pulse for the synapses is imminent.

After a finite delay, the spiking neuron generates a semi-programming pulse, which in itself cannot induce the programming of the synapse (PCM devices). The upstream and downstream neurons that received the alert pulse earlier respond via appropriate pulses with modulated amplitude (depending on the time elapsed since last firing of each neuron as retained in internal capacitors). Each response pulse combines with the semi-programming pulse to program each synapse (PCM devices) at the cross-point junction of involved neurons to achieve STDP. The post-synaptic neurons respond by sending rectangular pulses, which effectively increase the resistance (i.e., decrease conductance) of the synapse and the pre-synaptic neurons respond by sending triangular pulses, which effectively decrease the resistance (i.e., increase conductance) of the synapse.

The cross-bar array 200, which can be a nanoscale cross-bar array including the NVM devices 210 at the cross-point junctions, is employed to implement arbitrary and plastic connectivity between said electronic neurons. Each synapse device 422 further includes an access or control device 425 that can include a field-effect transistor (FET), which is not wired as a diode, at every cross-bar junction to prevent cross-talk during signal communication (neuronal firing events) and to minimize leakage and power consumption. It should be noted that in other embodiments, other types of circuits can be used as control devices 425, and an FET is used in the description herein as one possible example.

The electronic neurons 414, 416, 418, and 420 are configured as circuits at the periphery of the cross-bar array 200. In addition to being simple to design and fabricate, the cross-bar architecture provides efficient use of the available space. Complete neuron connectivity inherent to the full cross-bar array can be converted to any arbitrary connectivity by electrical initialization or omitting mask steps at undesired locations during fabrication. The cross-bar array 200 can be configured to customize communication between the neurons (e.g., a neuron never communicates with another neuron). Arbitrary connections can be obtained by blocking certain synapses at fabrication level. Therefore, the architectural principle of the system 400 can mimic all the direct wiring combinations observed in biological neuromorphic networks.

The cross-bar array 200 further includes driver devices $X_2$, $X_3$ and $X_4$ as shown in FIG. 4. The devices $X_2$, $X_3$ and $X_4$ can include interface driver devices. Specifically, the dendrites 426 have driver devices $X_2$ on one side of the cross-bar array 200 and level translator devices (e.g., sense amplifiers) $X_4$ on the other side of the cross-bar array. The axons 424 have driver devices $X_3$ on one side of the cross-bar array 200. The driver devices can include CMOS logic circuits implementing the functions described herein such as the "west" side and the "south" side (FIG. 3).

The sense amplifier devices $X_4$ feed into excitatory spiking electronic neurons ($N_e$) 414, 416 and 418, which in turn connect into the axon driver devices $X_3$ and dendrite driver devices $X_2$. The neuron 420 is an inhibitory spiking electronic neuron ($N_i$). Generally, an excitatory spiking electronic neuron makes its target neurons more likely to fire, while an inhibitory spiking electronic neuron makes its target neurons less likely to fire. A variety of implementations of spiking electronic neurons can be utilized. Generally, such neurons comprise a counter that increases when inputs from source excitatory neurons are received and decreases when inputs from source inhibitory neurons are received. The amount of the increase or decrease is dependent on the strength of the connection from a source neuron to a target neuron. If the counter reaches a certain threshold, the neuron then generates its own spike (i.e., fires) and the counter undergoes a reset to a baseline value. The term spiking electronic neuron is referred to as "electronic neuron" herein.

In one example scenario, the neurons 414, 416, 418, and 420 are dendritic neurons. Each dendritic neuron receives input from a corresponding translator device $X_4$. The neurons 414, 416, 418, and 420 also contain outputs and generate signals along paths 415 and 417 to a plurality of the devices $X_2$, $X_3$, respectively. Thus, the neurons 414, 416, 418, and 420 can function as axonal neurons when generating outputs along axonal connections. When any of the neurons 414, 416, 418, and 420 fire, they send a pulse out to their axonal and to their dendritic connections.

In this example, each of the excitatory neurons 414, 416, 418 (Ne) is configured to provide integration and firing. Each inhibitory neuron 420 (NO is configured to regulate the activity of the excitatory neurons depending on overall network activity. As those skilled in the art will recognize, the exact number of excitatory neurons and inhibitory neurons can vary depending on the nature of the problem to solve using the neuromorphic system 400.

A read spike of a short duration may be applied to an axon driver device X3 for communication. An elongated pulse may be applied to the axon driver device X3 and a short negative pulse may be applied to the dendrite driver device X2 midway through the axon driver pulse for programming. As such, the axon driver device X3 provides a long programming pulse and communication spikes. A dendrite driver device X2 provides a programming pulse with a delay. In one or more embodiments of the invention where a neuron circuit is implemented using analog logic circuits, a corresponding sense amplifier X4 translates synapse current levels to neuron current levels for integration. Alternatively, or in addition, where a neuron circuit is implemented using digital logic circuits, a corresponding sense amplifier X4 translates synapse current levels to binary digital signals for integration.

The FET driven synaptic devices 422 implement STDP in a time phased fashion. Such an implementation allows realization of high density electronic spiking neuronal networks, wherein spiking of neurons are restricted to certain time phases or a global timing reference, providing programming activity in synapses that are phased. In general, in accordance with an embodiment of the invention, axonal neurons "spike" or "fire" (transmit a pulse) when the inputs they receive from dendritic input connections exceed a threshold. In one example, a typical frequency required to mimic biological phenomena is about 10 KHz, leaving an ample time window for communication and programming of nanoscale electronic components.

In one or more embodiments of the invention, synaptic weight updates and communication in the neuromorphic network 10 are restricted to specific phases of a global timing reference signal (i.e., global clock), to achieve STDP. As the communication in the network is restricted to certain phases of the global timing reference signal, the FET devices 425 are utilized as access or control devices in the synapse (PCM devices)s 422. When a neuron spikes, the spike is communicated to X2 and X3 drivers, wherein each X3 driver control the source and the gate of a FET 425 in a corresponding synapse 422 via two conductive paths 424 and 427, respectively. In each synapse 422, the gate terminal of each FET is used as a membrane connected to a presynaptic neuron to enable precise control over the current flowing through the connected programmable resistor.

In general, the combined action of the signals from drivers X2 and X3 in response to spiking signals from the firing neurons in the cross-bar array 412, causes the NVM devices 210 in synapses 422 at the cross-bar array junctions thereof, to change value based on the spiking timing action of the firing neurons. This provides programming of the NVM devices 210. In an analog implementation of a neuron, each level translator device X4 comprises a circuit configured to translate the amount of current from each corresponding synapse 422 for integration by the corresponding neuron. For a digital implementation of a neuron, each level translator device X4 is a sense amplifier for accomplishing the same function.

The timing in delivering signals from the neurons in the cross-bar array 200 to the devices X2, X3, X4, and the timing of the devices X2, X3, X4 in generating signals, allows programming of the synapses. One implementation comprises changing the state of the NVM device 210 by increasing or decreasing conductance of the NVM device 210 as a function of time since a last spiking of an electronic neuron firing a spiking signal into the axon driver and the dendrite driver coupled by the NVM device 210. In general, neurons generate spike signals and the devices X2, X3, and X4 interpret the spikes signals, and in response generate signals described above for programming the synapses 422. The synapses and neurons can be analog or digital.

In one example, a read spike of a short duration (e.g., about 0.1 ms long) is applied to an axon driver device X3 for communication. An elongated pulse (e.g., about 200 ms long) is applied to the axon driver device X3. A short negative pulse (e.g., about 50 ns long) is applied to the dendrite driver device X2 about midway through the axon driver pulse for programming the synapses 422. As such, the axon driver device X3 provides a long programming pulse and communication spikes.

These signaling techniques are used for the operations to implement the DNN 100 using the cross-bar array 200 as depicted in FIG. 2A, FIG. 2B, and FIG. 2C. Referring to FIG. 2A, the forward propagation includes processing data through the neuron layers (110, 120, and 130) with the synaptic networks performing multiply-accumulate operations. The matrix-vector multiplications associated with the forward pass can be implemented with O(1) complexity using the depicted cross-bar array 200. For example, in order to perform Ax=b, where A is a matrix and x and b are vectors, the elements of A are mapped linearly to the conductance values of PCM devices 210 organized in the cross-bar 200. The x values are encoded into the amplitudes or durations of read voltages applied along the rows. The positive and negative elements of A are coded on separate devices together with a subtraction circuit. Alternatively, in one or more examples, negative vector elements are applied as negative voltages. The resulting currents along the columns are proportional to the result b. If inputs are encoded into durations, the result b is the total charge (e.g., current integrated over time). The property of the NVM device 210 that is used is the multi-level storage capability as well as the Kirchhoff circuit laws: Ohm's law and Kirchhoff's current law.

FIG. 2B depicts the backward propagation being performed by the cross-bar array 200. The same cross-bar configuration can be used to perform a matrix-vector multiplication with the transpose of A. For this, the input voltage is applied to the column lines and the resulting current is measured along the rows. Accordingly, the backward propagation involves a multiplication with the transpose of the matrix representing the synaptic weights, which can be realized with O(1) complexity in the same manner as described for the forward propagation above.

FIG. 2C depicts weight update, where the matrix elements are mapped to the conductance values of the NVM devices 210. Such mapping can be achieved via iterative programming using the programming curve as described herein.

It should be noted that the description of the cross-bar array 210 and of the neuromorphic system 400 is one possible example implementation, and that one or more embodiments of the present invention can be used in other types of implementation.

Typically, programming the NVM device 210 (updating the weights) is done by iteratively applying SET pulses with steadily increasing compliance current. Unlike RESET pulses, which can cause an abrupt transition to lower conductance values, the successive application of a partial SET pulse is considered to result in a more progressive increase in the conductance value of the NVM devices 210. Hence, for neuromorphic systems 400 using NVM devices 210, in existing solutions the partial SET pulses are used to implement synaptic plasticity rules.

For example, the typical programming strategy for analog conductance tuning of NVM devices 210 is to iteratively apply SET pulses with steadily increasing compliance current (while also potentially increasing pulse duration) to reach target analog conductance values. However, technical challenges exist with this technique. For example, after a certain current threshold is reached, a subset of the NVM devices 210 can get partially RESET during the applied pulse, causing conductance to decrease rather than increase. The current threshold varies from PCM device-to-device and is thus difficult to control over cross-bar arrays as the number of NVM devices 210 increases.

One or more embodiments of the present invention address such technical challenges by using a programming technique. One or more embodiments of the present invention use a strategy to iteratively apply RESET pulses with decreasing compliance current (while also potentially increasing pulse duration) to reach target conductance. When compliance current drops below current threshold for RESET, the pulse becomes a SET pulse, but PCM conductance values remain at or near the highest conductance values even as programming conditions become no longer effective. In addition, precision at low conductance values is substantially improved compared to existing techniques as noted by experimentation. The programming technique demonstrated using one or more embodiments of the present invention is compatible with a row-by-row programming scheme and can complete in finite number of cycles. The programming results are tolerant to device-to-device variability in array. Further, techniques described herein minimizes circuit area and power costs associated with physical implementation by using only two bits per weight: one participation bit and one sign bit. Other advantages and practical applications of one or more embodiments of the present invention will be apparent from the description herein.

One or more embodiments of the present invention address the technical challenges with existing techniques by using an iterative programming sequence that achieves desired analog conductance values in a cross-bar array of PCM devices under the presence of variability. The programming sequence is iterative but uses a limited number of programming steps to bring conductance values within a desired range from the target analog conductance.

The programming sequence begins with initializing all NVM devices in a soft reset state, then iteratively programming by first tuning the reset pulse length at a certain compliance current, then gradually reducing compliance current until NVM conductance is in the target range. The exact programming parameters, such as compliance current and time duration of the pulses, depend on the cross-bar array. One or more embodiments of the present invention facilitate how to determine these programming parameters through cross-bar array characterization. The programmed weights in the cross-bar array are shown to achieve reasonable performance for DNNs, for example, for forward inference. The use of multiple pairs of conductance to represent one weight in the DNN also improves programming accuracy.

Figure 5:
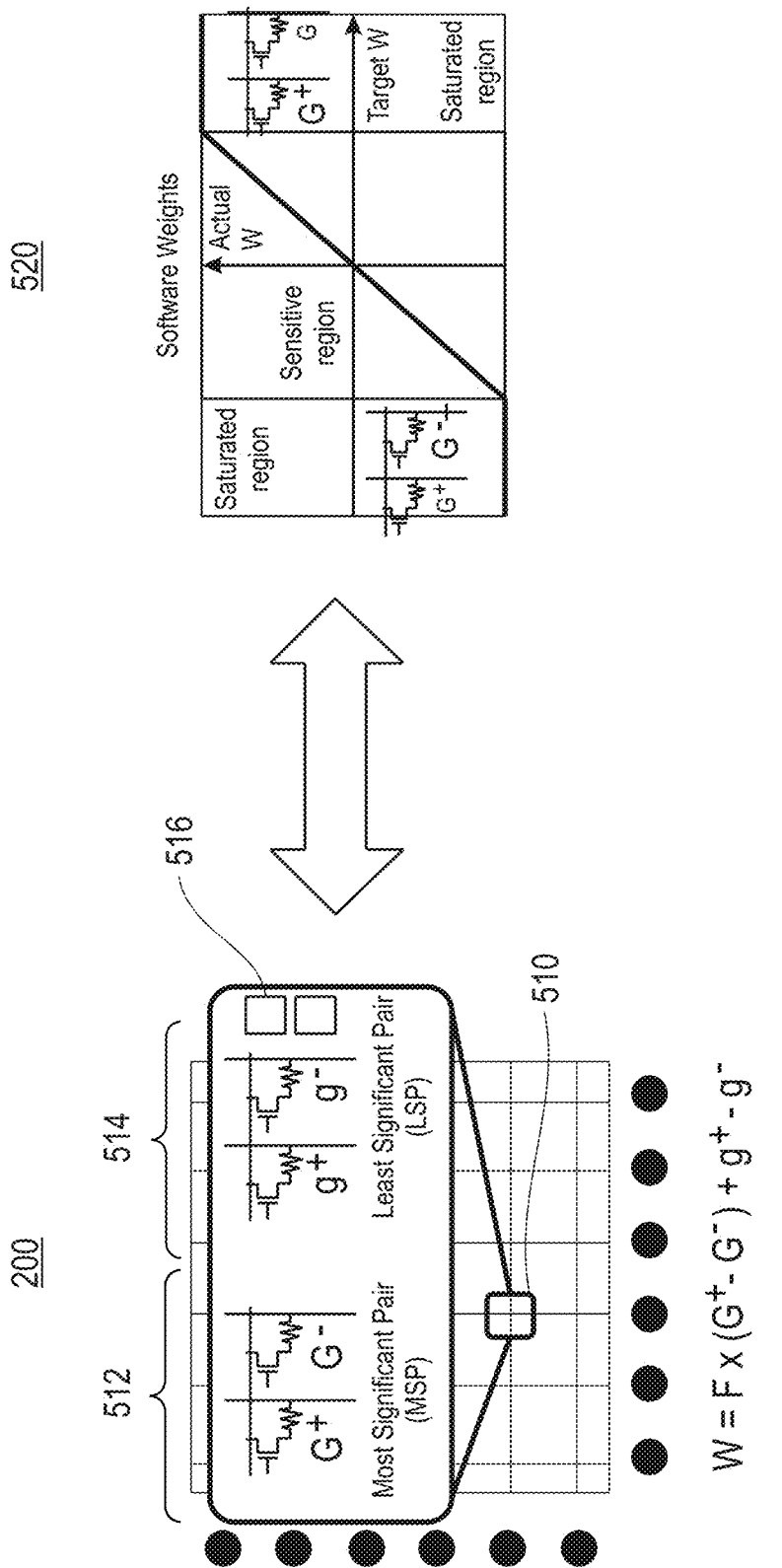
FIG. 5 depicts a schematic for mapping weights into phase change memory devices according to one or more embodiments of the present invention.

FIG. 5 depicts a schematic for mapping weights into phase change memory devices according to one or more embodiments of the present invention. A set of NVM adjacent devices 210 from the cross-bar array 200 is configured to form a "conductance unit" 510. The conductance unit 510 is used to represent a weight value from the DNN 100. In the illustrated example of FIG. 5, two pairs (i.e., four PCM devices 210 from the cross-bar array 200) are mapped to a weight by programming the conductance values of the four PCM devices 210 in the conductance unit 510. The total weight (in conductance, e.g., µS) is a weighted sum of the 4 PCM conductance values, which are divided into a More Significant Pair (MSP) 512 and a Less Significant Pair (LSP) 514 of conductance values with a significance factor of F. Accordingly, the weight associated with the conductance unit 510, which includes the two pairs of PCM devices 210 can be represented by: $W=F(G^+ - G^-)+g^+ - g^-$, where (G+, G−) are the conductance values of the PCM devices 210 in the MSP 512, and (g+, g−) are the conductance values of the PCM devices 210 in the LSP 514. The + and − signs are assigned to the PCM devices 210 at initiation. Designating a PCM device 210 as part of the MSP/LSP and further assigning a sign to the PCM device 210 can be part of assigning a "role" to each PCM device 210 in the cross-bar array 200. The significance factor F is a predetermined value and can be a different value associated with each column of the PCM devices 210 in the cross-bar array.

Weights in conductance units are then mapped to the software weights 520 of the DNN 100 using a scaling factor α. For example, the software weights may have to be scaled to a dynamic range supported by the non-volatile memory devices 210. The dynamic range indicates the range of current values that the NVM devices 210 can contribute based on the range of device conductance it can hold. Set of distinguishable current values represent the effective bit resolution of the analog memory device. Dynamic range reflects the maximum and minimum values of weight or conductance that occurs in the target set of weight/conductance. Effective bit resolution is determined by device characteristics, such as read and write noise; dynamic range in conductance depends on F factor and the conductance range of each analog memory device, while dynamic range in software weights depends on the software training procedure (e.g., hyper-parameters, optimizer, etc.). The dynamic range can be the given numerical range of the pre-trained weights to be programmed.

The significance factor F and scaling factor α are optimized using a configurable value referred herein as "probability of programming failure (Pfail)." When target weights are mapped to a low conductance range, the conductance response of PCM devices 210 is coarse. On the other hand, when the target weights are mapped to a high conductance range, Pfail increases due to the limited conductance range of the PCM devices 210. High F represents an imbalance between the MSP 512 and the LSP 514, which can adversely affect weight convergence across the PCM devices 210 in the cross-bar array. Low F (e.g., F<1) effectively reverse the roles of the MSP 512 and the LSP 514 and also result in higher Pfail. In one or more embodiments of the present invention, Pfail is computed dynamically by counting the number of weights that are not in the target conductance range.

According to one or more embodiments of the present invention, the conductance unit 510 further includes a selection/participation flag 516 that is used to indicate a selection of the conductance unit 510 for a subsequent update of the conductance value. For example, the selection flag 516 can be a bit, where the bit being 1 (or 0) can indicate that the conductance unit 510 is to be updated in a subsequent iteration. In this case, marking the selection flag 516 to 0 (or 1) can indicate removal of the conductance unit 510 from a set of conductance units that are to be updated in subsequent iteration(s). It is understood that the selection flag 516 can be implemented in any other manner than using a bit.

Figure 6:
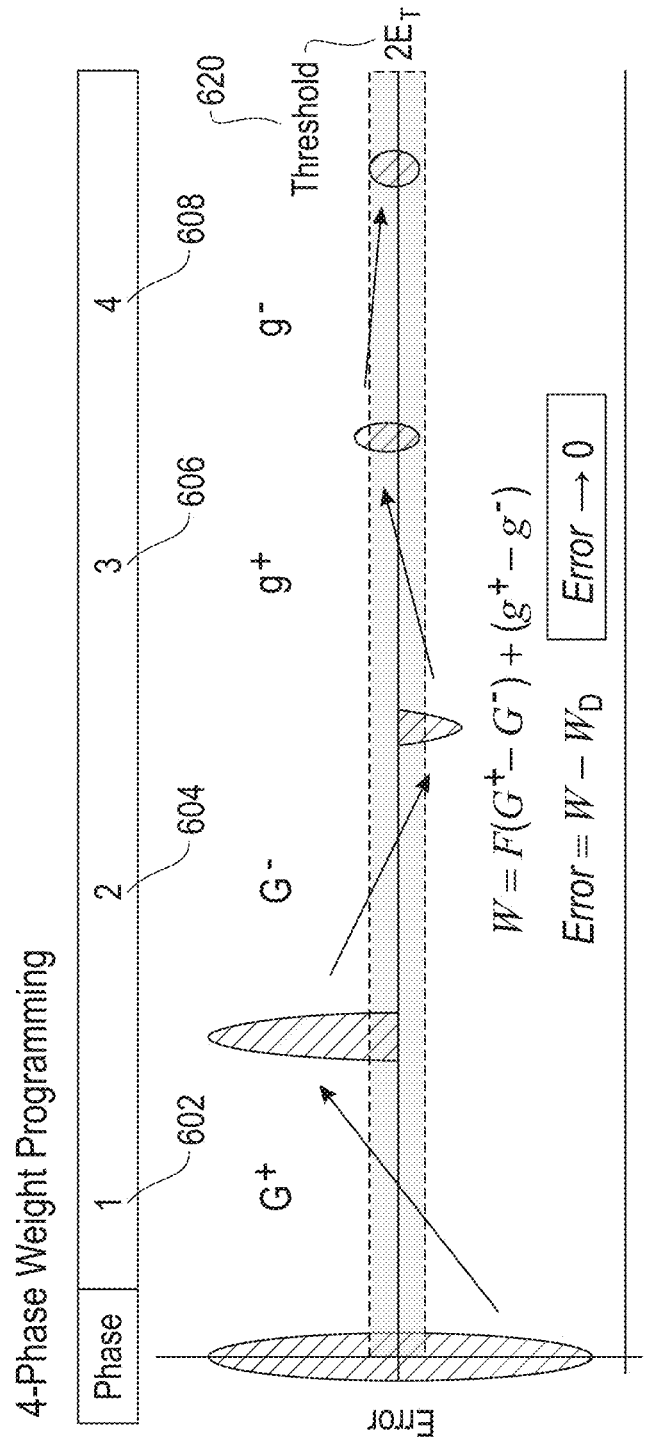
FIG. 6 depicts a visualization of mapping a desired weight to a conductance unit according to one or more embodiments of the present invention.

FIG. 6 depicts a visualization of mapping a desired weight to a conductance unit according to one or more embodiments of the present invention. The mapping is performed over four phases (602, 604, 606, and 608), in each phase a conductance of one of the four PCM devices 210 from the conductance unit 510 being adjusted. The adjustment is performed using closed loop programming, to reduce error between a desired weight ($W_D$) that is to be configured for the conductance unit 510 and an actual weight W of the conductance unit 510. The Error=$W-W_D$. Alternatively, the error can be computed as $W_D-W$, or an absolute value of that subtraction. An error threshold 620 is used to check if the conductance values that have been adjusted are satisfactory or if further adjustments to the conductance values are required. The closed loop programming is performed to ensure that the computed error is within the predetermined error threshold 620, and the conductance values are adjusted until the condition is met.

The closed loop programming includes pulse-width and compliance current modulation. In one or more embodiments of the present invention, the pulse-width modulation is used to account for the conductance units 510 that are below and above the predetermined threshold being targeted. Once the conductance unit 510 has a weight substantially within the predetermined threshold 620 (e.g., ±0.25 uS) of the desired weight, the conductance unit 510 is removed from a set of conductance units that have to be adjusted in subsequent iterations. According to one or more embodiments of the present invention, compliance current is stepped down to RESET PCM devices 510 from hard RESET through partial RESET to partial SET, in order to gradually increase PCM conductance until it reaches the vicinity of the desired target conductance. Here "vicinity of the desired target conductance" indicates that the weight (W) of the conductance unit 510 is within the threshold 620 from the target weight ($W_D$).

In one or more embodiments of the present invention, positive weights are mapped using $W=FG^+ + g^+$, and negative weights $G^-$ and $g^-$ are held at Reset state. Further, the negative weights are mapped in an opposite manner for negative weights. Further, $G^+$ is programmed first, and then the residual error is corrected using $g^+$ or $g^-$. Such program operation on $G^+$ (or $G^-$), leaving $G^-$ (or $G^+$) in the reset state, leads to symmetric noise distributions. The programming error on G is multiplied by the F factor (e.g. F=3).

Figure 7:
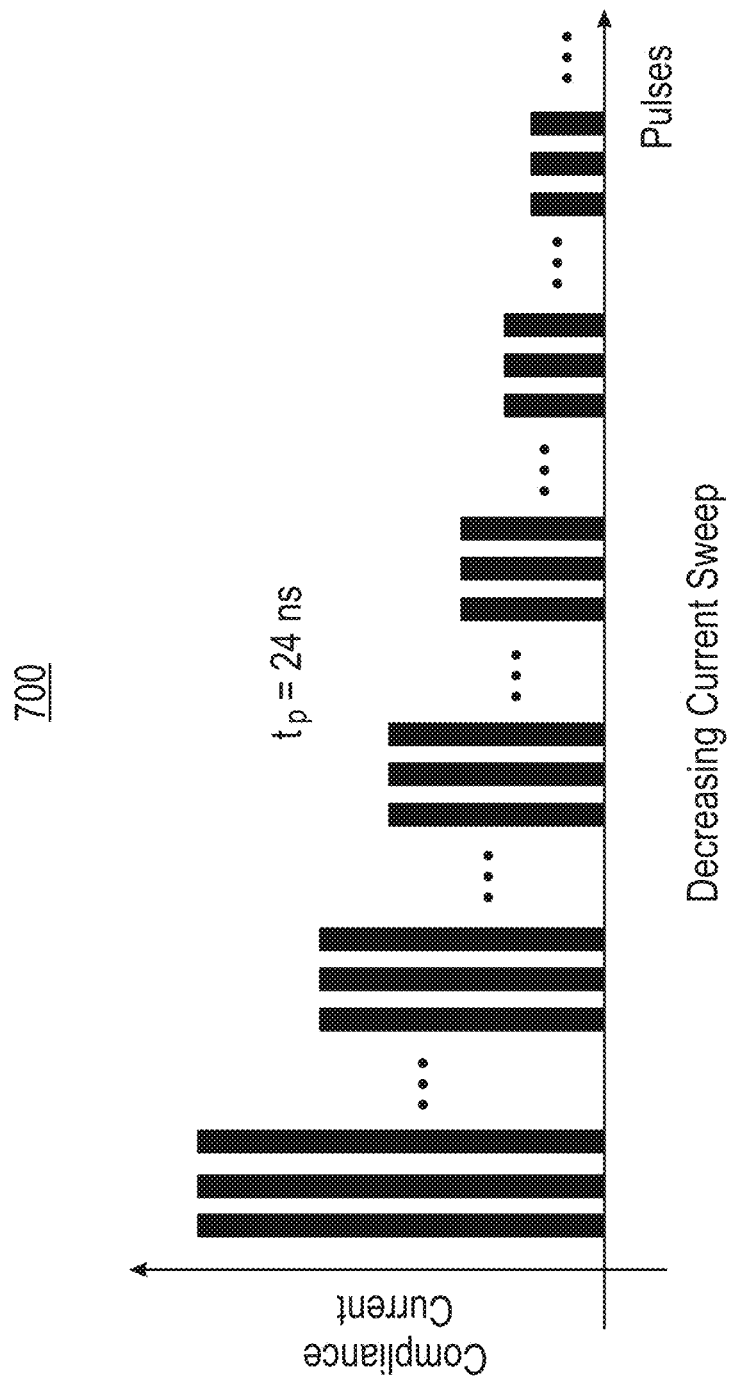
FIG. 7 shows an example of decreasing current sweep according to one or more embodiments of the present invention.

FIG. 7 shows an example of decreasing current sweep according to one or more embodiments of the present invention. The depicted plot 700 shows a decreasing current sweep that is performed as an initial pulse sequence where each conductance unit 510 receives the decreasing values (magnitudes) of compliance current for a predetermined duration (i.e., pulse width), for example, $t_p$=24 ns. The compliance current values received by each conductance unit 510 are based on a uniform target, for example, 2 µS. The pulse width and the uniform target that are predetermined for the conductance units 510 can be different in other embodiments. The compliance current value can be a predetermined value based on the cross-bar array 200.

After such a first sequence of compliance current sweep, the error at each conductance unit 510 is computed to determine which of the conductance units 510 have reached their target weights. Based on the computed errors, only certain conductance units 510, i.e., certain groups of the PCM devices 210, are selected to participate in the subsequent pulse sweep. PCM devices 210 that successfully fall into the "target confidence" range are not selected (removed from) in the group of PCM devices 210 receiving the subsequent pulses. Here the "target confidence" range is based on the conductance response to the previous programming pulses, and the conductance units 510. In turn, the PCM devices in such conductance units are marked as being in the target confidence range, when the error between the target weight and actual weight is within the predetermined threshold 620. Further, multiple sequences (each consisting of a full sweep from high to low current values) of pulses of various constant durations are applied to the selected conductance units 510.

Figure 8:
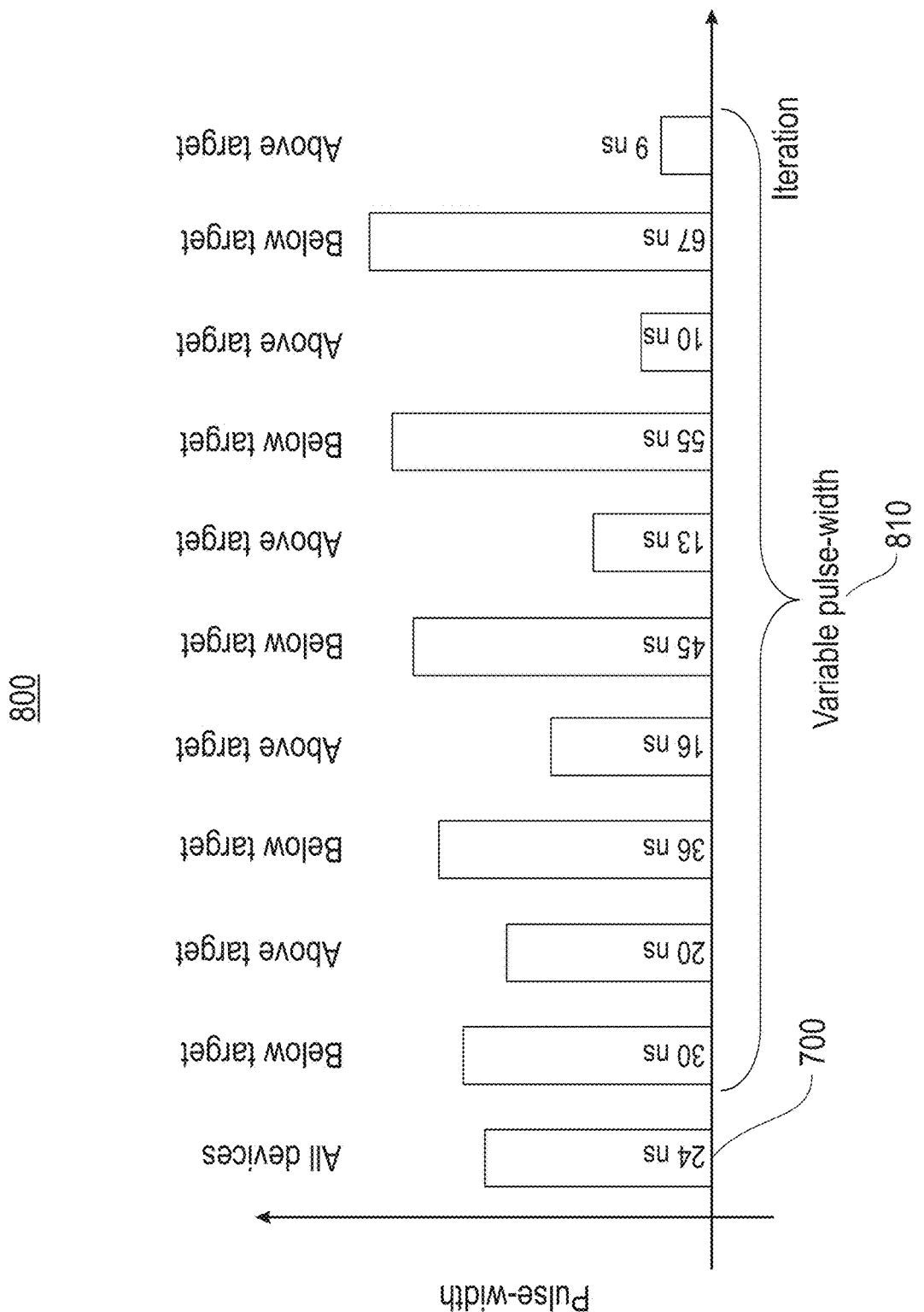
FIG. 8 depicts a sequence of pulses being sent to the conductance units according to one or more embodiments of the present invention.

FIG. 8 depicts a sequence of pulses being sent to the conductance units according to one or more embodiments of the present invention. As shown in the plot 800, the initial compliance current sweep 700 for the predetermined uniform target is completed with decreasing current sweep at constant pulse duration. Based on the target confidence ranges of the conductance units 510 after the initial current sweep 700, additional pulse sequences 810 are sent with variable pulse widths. The pulse width of each pulse sequence 810 depends on the error at the conductance unit 510 that receives that pulse sequence.

After each set of the variable-width pulse sequences 810, the selection of the conductance units 510 in the target confidence range is performed based on the error at each of the conductance units 510. For those conductance units 510 that are not yet in the target confidence range, the process is iterated upon by sending additional variable-width pulse sequences 810 and checking the corresponding errors.

Programming the conductance units 510 in the cross-bar array 200 in this manner achieves accurate conductance programming despite device variability in the cross-bar array 200. Further yet, weight programming using one or multiple conductance pairs to represent each weight shows lower noise compared to conductance programming noise from single devices. Also, mapping weights to 4 PCM devices 210 (2 pairs of PCMs) significantly reduces weight error in one or more embodiments of the present invention. However, it should be noted that weights can be mapped to a different number of PCM devices 210 configured as a conductance unit 510 in other embodiments of the present invention. Various experiments performed have demonstrated that software equivalent accuracies are achieved for DNNs, for example, Long-Short-Term-Memory networks, with weight mapping and programming techniques in one or more embodiments of the present invention.

Figure 9:
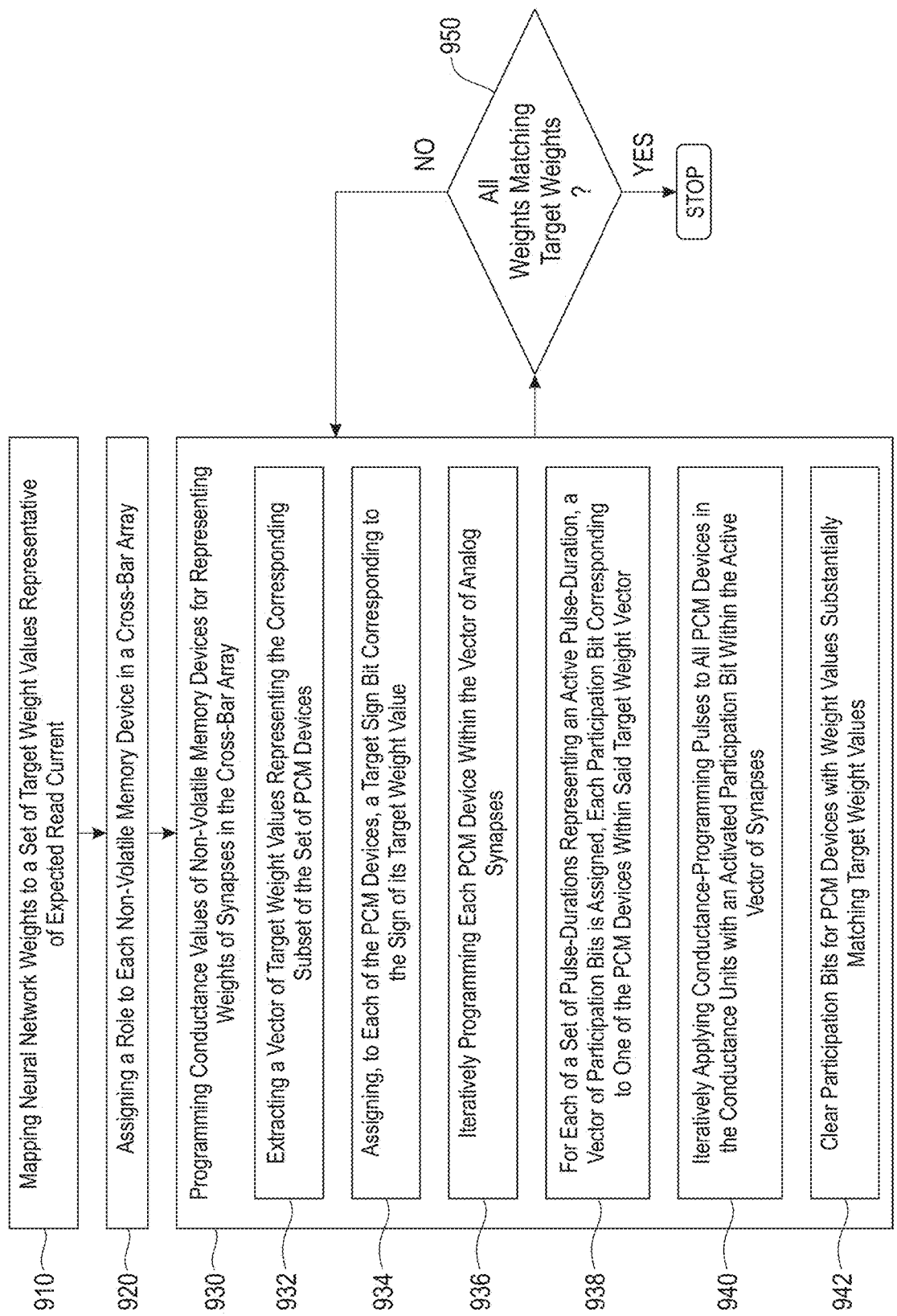
FIG. 9 depicts a flowchart of a method for programming neural network weights into analog synapses implemented using a cross-bar array according to one or more embodiments of the present invention.

FIG. 9 depicts a flowchart of a method for programming neural network weights into analog synapses implemented using a cross-bar array according to one or more embodiments of the present invention. The synapses in this case are the conductance units 510 and are one or more pairs of non-volatile memory devices, such as the PCM devices 210 in the cross-bar array 200. The method includes mapping the neural network weights to a set of target weight values representative of expected read current, at 910. The mapping can include calibrating what current values represent what weight value in the synapse based on a dynamic range of the PCM devices 210.

The method further includes assigning each PCM device 210 within each analog synapse 510 to one of a set of roles, with each role uniquely identified by both analog significance and sign, at 920. Setting the role includes configuring a group of one or more PCM devices 210 as part of the conductance unit 510, where the conductance of the conductance unit 510 represents the weight value of an analog synapse. In other words, the conductance unit 510 represents the analog synapse from the DNN 100. Further, setting the role can include associating the PCM device 210 as part of either the MSP 514 or the LSP 512, and a position in either of those. The position can be set using a sign flag (e.g., bit). The sign flag indicates an order in which the PCM devices 210 in the conductance unit 510 are updated during a weight update/programming.

The method further includes programming the synapses with the weights, at 930. Programming the synapses includes extracting a vector of target weight values representing the corresponding subset of the set of PCM devices 210 from each row, column, or other addressable subset of the cross-bar array 200 of analog synapses, at 932. Further, the method includes assigning, to each of the PCM devices 210, a target sign bit corresponding to the sign of its target weight value, at 934. Further, the method includes iteratively programming each PCM device 210 within the vector of analog synapses, from the MSP 512 to the LSP 514, with the sign bit identifying the order in which members of the pair should be programmed, at 936. For example, the positive (+) PCM device 210 is programmed first in one or more embodiments of the present invention. In other embodiments, the negative (−) assigned PCM device 210 is programmed first.

Further, for each of a set of pulse-durations representing an active pulse-duration, a vector of participation bits is assigned, each participation bit corresponding to one of the PCM devices 210 within said target weight vector, wherein the participation bit is activated for any synapse that requires additional programming of the conductance role being programmed within each synapse, at 938. The participating bit indicates that the conductance value has to be further adjusted using one or more pulse sequences.

The method further includes iteratively applying conductance-programming pulses to all PCM devices in the conductance units with an activated participation bit within the active vector of synapses, at 940. In one or more examples, the pulse sequence(s) is applied starting from higher programming current and proceeding towards lower programming currents (decreasing). In each iteration, the method includes measuring the total effective weight of each member of the vector of active synapses and comparing it to the associated target weight value, at 942. Based on the comparison, the participation bit for the active synapses is cleared, at 942. The bit is cleared for synapses for which the measured weight value has reached the associated target weight value, i.e., the error is less than (or equal to) the predetermined threshold 620.

The above programming step is repeated with the programming pulse sequence but with (i) longer pulses to address conductance values that were under-programmed, at 944 and (ii) shorter pulses to address conductance values that were over-programmed, at 946. Here, under-programmed indicates that the desired conductance is more than the actual conductance, while over-programmed indicates that the desired conductance is less than the actual conductance in the PCM devices 210.

The programming is repeated until all conductance roles are addressed, in order from higher to lower significance across the cross-bar array 200, at 950.

The non-volatile memory devices 210 in the cross-bar array 200 can be any one of Phase-Change Memory (PCM) devices, Resistance Random Access Memory (RRAM), and the like.

Accordingly, one or more embodiments of the present invention provide an iterative programming sequence that achieves desired analog conductance values in a cross-bar array of NVM devices such as PCM devices under the presence of variability. The programming sequence provided is iterative and uses a limited number of programming steps to bring conductance values within a desired range from the target analog conductance. As described in detail, the programming sequence begins with initializing all PCM devices in a soft reset state then iteratively programming by first tuning reset pulse length at a certain compliance current, and subsequently gradually reducing compliance current until PCM conductance is in the target range. Exact programming parameters, such as compliance current and time duration of the pulses, would depend on the cross-bar array and can be configurable predetermined parameters. The programmed weights in the cross-bar array can be used to implement a DNN, such as for forward inference.

According to one or more embodiments of the present invention multiple pairs of conductance are used to represent one weight in the DNN to improve programming accuracy.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source-code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   updating initial weight values associated with a plurality of analog synapses in a cross-bar array that implements an artificial neural network, by sending a pulse sequence to the plurality of analog synapses, each of the analog synapses comprising a conductance unit, wherein an updated weight value of the analog synapse is based on a conductance value of the conductance unit, the pulse sequence changing the conductance value of the conductance unit;
   comparing the updated weight values of the plurality of analog synapses with target weight values associated with the analog synapses;
   selecting a set of analog synapses from the cross-bar array based on the comparison, the selection indicated using a selection flag associated with the analog synapses; and
   updating the weight values of each of the analog synapses from the set of analog synapses that is selected, by sending, to the set of analog synapses, a set of electric pulses of varying durations, the set of electric pulses changing the conductance values of the conductance units corresponding to the set of analog synapses.

2. The computer-implemented method of claim 1, wherein the pulse sequence that is sent to the plurality of analog synapses is of a predetermined duration and wherein the uniform weight pulse sequence comprises a plurality of electric current pulses with decreasing magnitudes.

3. The computer-implemented method of claim 1, wherein the conductance unit comprises a plurality of non-volatile memory devices.

4. The computer-implemented method of claim 3, wherein a weight value associated with the analog synapse is computed based on conductance values of each of the plurality of non-volatile memory devices.

5. The computer-implemented method of claim 4, wherein the non-volatile memory devices are phase change memory devices.

6. The computer-implemented method of claim 4, wherein the non-volatile memory devices are resistance random access memory devices.

7. The computer-implemented method of claim 4, wherein the plurality of non-volatile memory devices comprises four non-volatile memory devices, which are configured to form a more-significant pair (MSP) and a less-significant pair (LSP).

8. The computer-implemented method of claim 7, wherein a weight value of the analog synapse is computed as $W=F\times(G^+-G^-)+g^+-g^-$, where F is a scaling factor, $G^+$ and $G^-$ are conductance values of the MSP, and $g^+$ and $g^-$ are conductance values of the LSP.

9. The computer-implemented method of claim 7, wherein changing the conductance value of a conductance unit comprises changing conductance values of each of the non-volatile memory devices from the conductance unit according to a predetermined order for updating the conductance values.

10. The computer-implemented method of claim 9, wherein, according to the predetermined order, the conductance values of the non-volatile memory devices in the MSP are updated first.

11. The computer-implemented method of claim 10, wherein, further according to the predetermined order, the conductance value of the non-volatile memory devices in the MSP are updated according to a sign flag associated with the non-volatile memory devices.

12. The computer-implemented method of claim 1, wherein selecting the set of analog synapses comprises selecting the set of analog synapses for which a difference between weight values and target values is greater than a predetermined threshold.

13. The computer-implemented method of claim 1, further comprising, removing a first analog synapse from the set of analog synapses, wherein the difference in the weight value and the target weight value for the first analog synapse is within the predetermined threshold.

14. The computer-implemented method of claim 13, wherein the first analog synapse is removed from the set of analog devices in response to the weight value of the first analog synapse being updated by the set of electric pulses of varying durations.

15. The computer-implemented method of claim 1, wherein the set of electric pulses of varying durations comprises a first electric pulse for a first analog synapse, the first electric pulse based on a first difference between the weight value and the target weight value of the first analog synapse.

16. A system comprising:
   a processor; and
   a co-processor comprising one or more cross-bar arrays; and, wherein
   the processor is configured to implement an artificial neural network using the co-processor by mapping a layer of the artificial neural network with a cross-bar array, wherein implementing the artificial neural network comprises a method comprising:
   updating initial weight values associated with a plurality of analog synapses in a cross-bar array that implements an artificial neural network, by sending a pulse sequence to the plurality of analog synapses, each of the analog synapses comprising a conductance unit, wherein an updated weight value of the analog synapse is based on a conductance value of the conductance unit, the pulse sequence changing the conductance value of the conductance unit;

comparing the updated weight values of the plurality of analog synapses with target weight values associated with the analog synapses;

selecting a set of analog synapses from the cross-bar array based on the comparison, the selection indicated using a selection flag associated with the analog synapses; and updating the weight values of each of the analog synapses from the set of analog synapses that is selected, by sending, to the set of analog synapses, a set of electric pulses of varying durations, the set of electric pulses changing the conductance values of the conductance units corresponding to the set of analog synapses.

17. The system of claim 16, wherein the conductance unit comprises a plurality of non-volatile memory devices.

18. The system of claim 17, wherein a weight value associated with the analog synapse is computed based on conductance values of each of the plurality of non-volatile memory devices.

19. The system of claim 18, wherein the plurality of non-volatile memory devices comprises four non-volatile memory devices, which are configured to form a more-significant pair (MSP) and a less-significant pair (LSP), and wherein a weight value of the analog synapse is computed as $W=F\times(G^+-G^-)+g^+-g^-$, where F is a scaling factor, $G^+$ and $G^-$ are conductance values of the MSP, and $g^+$ and $g^-$ are conductance values of the LSP.

20. A computer program product comprising a computer readable storage medium having program instructions embodied therewith, the program instructions executable by a processing circuit to perform a method to implement an artificial neural network by mapping a layer of the artificial neural network with a cross-bar array, wherein implementing the artificial neural network comprises:

updating weight values associated with a plurality of analog synapses in the cross-bar array by sending a pulse sequence to the plurality of analog synapses in the cross-bar array, each analog synapse comprising a conductance unit, wherein a weight value of the analog synapse is based on a conductance value of the conductance unit, and the pulse sequence changing the conductance value of the conductance unit;

comparing the weight values of the plurality of analog synapses with target weight values associated with the analog synapses;

selecting a set of analog synapses from the cross-bar array based on the comparison, the selection indicated using a selection flag associated with the analog synapses; and updating the weight values of the each analog synapse from the set of analog synapses that is selected by sending, to the set of analog synapses, a set of electric pulses of varying durations, the set of electric pulses changing the conductance values of the conductance units corresponding to the set of analog synapses.

21. The computer program product of claim 20, wherein the conductance unit comprises a plurality of non-volatile memory devices.

22. The computer program product of claim 21, wherein a weight value associated with the analog synapse is computed based on conductance values of each of the plurality of non-volatile memory devices.

23. The computer program product of claim 22, wherein the plurality of non-volatile memory devices comprises four non-volatile memory devices, which are configured to form a more-significant pair (MSP) and a less-significant pair (LSP), and wherein a weight value of the analog synapse is computed as $W=F\times(G^+-G^-)+g^+-g^-$, where F is a scaling factor, $G^+$ and $G^-$ are conductance values of the MSP, and $g^+$ and $g^-$ are conductance values of the LSP.

24. A cross-bar array comprising:

a plurality of phase change memory devices, one of the phase change memory devices being located at each of a plurality of cross-points in the cross-bar array, wherein every set of four phase change memory devices forms a conductance unit, and a plurality of conductance units represents a plurality of analog synapses in an artificial neural network;

an electric circuit configured to program conductance values of the phase change memory devices by performing a method comprising:

receiving a pulse sequence for the plurality of analog synapses in the cross-bar array, wherein a weight value of an analog synapse is based on a conductance value of the conductance unit, and the pulse sequence changes the conductance value of the conductance unit; and updating the weight values of each of the analog synapses from a set of analog synapses that is selected by receiving, for the set of analog synapses, a set of electric pulses of varying durations, the set of electric pulses changing the conductance values of the conductance units corresponding to the set of analog synapses, wherein the set of analog synapses from the cross-bar array is selected based on comparing the weight values of the plurality of analog synapses with target weight values associated with the analog synapses.

25. A computer-implemented method comprising:

configuring, from a plurality of phase change memory devices in a cross-bar array, two pairs of phase change memory devices as a conductance unit, wherein the plurality of conductance units represents a plurality of analog synapses in an artificial neural network;

sending a pulse sequence to the plurality of analog synapses in the cross-bar array, wherein a weight value of an analog synapse is based on a conductance value of the conductance unit, and the pulse sequence changes the conductance value of the conductance unit; and updating the weight values of each of the analog synapses from a set of analog synapses that is selected by sending, to the set of analog synapses, a set of electric pulses of varying durations, the set of electric pulses changing the conductance values of the conductance units corresponding to the set of analog synapses, wherein the set of analog synapses from the cross-bar array is selected based on comparing the weight values of the plurality of analog synapses with target weight values associated with the analog synapses.

* * * * *